United States Patent
Li et al.

(10) Patent No.: US 10,680,566 B2
(45) Date of Patent: Jun. 9, 2020

(54) NOISE-CANCELING TRANSIMPEDANCE AMPLIFIER (TIA) SYSTEMS

(71) Applicant: Hewlett Packard Enterprise Development LP, Houston, TX (US)

(72) Inventors: Cheng Li, Palo Alto, CA (US); Zhihong Huang, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 51 days.

(21) Appl. No.: 15/768,864

(22) PCT Filed: Oct. 23, 2015

(86) PCT No.: PCT/US2015/057142
§ 371 (c)(1),
(2) Date: Apr. 17, 2018

(87) PCT Pub. No.: WO2017/069776
PCT Pub. Date: Apr. 27, 2017

(65) Prior Publication Data
US 2019/0131942 A1    May 2, 2019

(51) Int. Cl.
*H03F 3/08*    (2006.01)
*H03F 3/30*    (2006.01)
(Continued)

(52) U.S. Cl.
CPC .......... *H03F 3/3016* (2013.01); *H03F 1/086* (2013.01); *H03F 1/26* (2013.01); *H03F 3/082* (2013.01);
(Continued)

(58) Field of Classification Search
CPC ........ H03F 3/3016; H03F 1/086; H03F 3/082; H03F 1/26; H03F 2200/372; H03F 3/08; H03F 3/087
(Continued)

(56) References Cited

U.S. PATENT DOCUMENTS

| | | | |
|---|---|---|---|
| 6,504,429 B2 * | 1/2003 | Kobayashi | H03F 3/08 330/282 |
| 8,346,096 B2 * | 1/2013 | Yazaki | H04B 10/693 330/263 |

(Continued)

FOREIGN PATENT DOCUMENTS

| | | |
|---|---|---|
| CN | 102751953 A | 10/2012 |
| CN | 204046530 U | 12/2014 |

(Continued)

OTHER PUBLICATIONS

Singh D. et al., "A Study on Transimpedance Amplifier in 0.35 μm CMOS Technology," (Research Paper), Aug. 2012, vol. 51, No. 21, 6 pages.

*Primary Examiner* — Khanh V Nguyen
(74) *Attorney, Agent, or Firm* — Hewlett Packard Enterprise Patent Department

(57) ABSTRACT

One embodiment describes a transimpedance amplifier (TIA) system. The system includes an inverter TIA stage interconnecting an input node and an output node and configured to invert an input signal at the input node to provide a first inverted signal component at the output node. The system also includes a noise-canceling inverter stage arranged in parallel with the inverter stage and being configured to invert the input signal to provide a second inverted signal component and to invert noise from the input node. Thus, the first and second inverted signal components constructively combine at the output node and the noise is substantially mitigated at the output node.

20 Claims, 2 Drawing Sheets

(51) Int. Cl.
*H03F 1/26* (2006.01)
*H03F 1/08* (2006.01)

(52) U.S. Cl.
CPC ........ *H03F 3/087* (2013.01); *H03F 2200/372* (2013.01)

(58) Field of Classification Search
USPC ................. 330/59, 308; 250/214 A, 214 AG
See application file for complete search history.

(56) References Cited

U.S. PATENT DOCUMENTS

| | | | |
|---|---|---|---|
| 8,593,226 B2* | 11/2013 | Proesel | H03F 3/08 330/260 |
| 8,686,739 B2 | 4/2014 | Johansen et al. | |
| 8,872,592 B2 | 10/2014 | Huang et al. | |
| 9,407,218 B2* | 8/2016 | Huang | H03F 3/45071 |
| 9,843,295 B2* | 12/2017 | Park | H03F 3/45475 |
| 2003/0214353 A1 | 11/2003 | Yoon | |
| 2009/0110409 A1 | 4/2009 | Zou | |
| 2011/0217045 A1* | 9/2011 | Watson | G02B 6/12002 398/79 |

FOREIGN PATENT DOCUMENTS

| | | |
|---|---|---|
| DE | 4212934 A1 | 10/1993 |
| JP | 2011029738 | 2/2011 |
| JP | 2012147312 | 8/2012 |

* cited by examiner

US 10,680,566 B2

NOISE-CANCELING TRANSIMPEDANCE AMPLIFIER (TIA) SYSTEMS

BACKGROUND

Transimpedance amplifier (TIA) systems, such as voltage-mode inverter TIAs, can be implemented in a variety of circuit applications. As an example, voltage-mode inverter TIAs can be implemented for a variety of optical receiver front-end circuits. For example, a current corresponding to an intensity of an optical signal can be provided to the TIA system, such that the TIA system can convert the current to a voltage in a high-speed optical communication application. However, in a typical TIA, such as an inverter TIA, bandwidth can be deteriorated and noise can be prevalent, even with small variations of the parasitic input capacitances (e.g., associated with an input source, such as a photodiode). Typically, a relatively high optical input power is implemented for an inverter TIA to achieve sufficient bit-error rate (BER) performance. However, such a large input optical intensity can affect the amplifier linearity and distort the resultant output signal.

DETAILED DESCRIPTION

A noise-cancelling transimpedance amplifier (TIA) exploits an inverter-based input stage with a feed-forward resistor in parallel with a feed-forward common-source amplifier stage to achieve low noise and high gain. The thermal noise at the input node can be cancelled due to the inverted noise phases at the output node, while the two signal components provided via the two parallel amplification stages experience the same phase amplification based on the input signal being constructively combined at the output node. While the input signal is constructively combined, the noise is provided to the output node via the feed-forward resistor and is inverted by the common-source amplifier stage, resulting in destructive combination of the noise to substantially cancel it. By reducing the circuit thermal noise and nearly doubling the transimpedance gain, this dual-mode noise canceling TIA is especially suitable for high sensitivity optical receiver systems.

Figure 1:
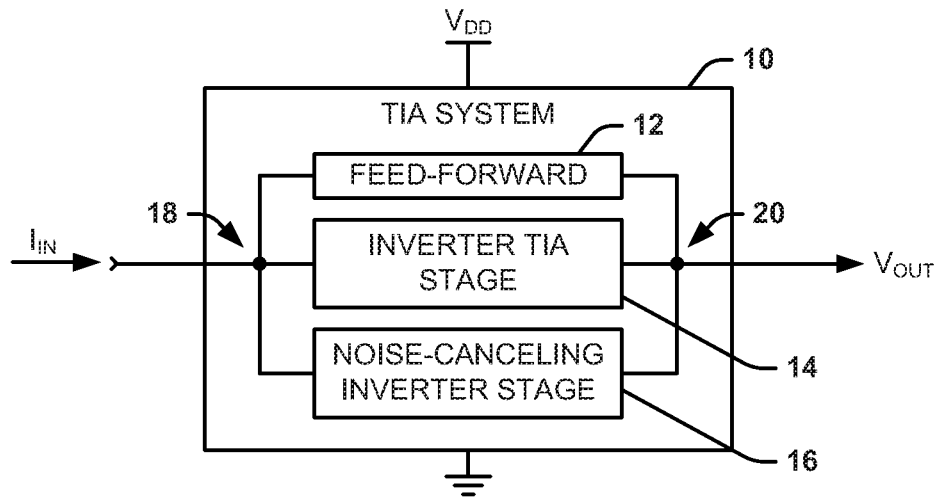
FIG. 1 illustrates an example of a transimpedance amplifier system.

FIG. 1 illustrates an example of a TIA system 10. The TIA system 10 can be implemented in a variety of applications, including an optical receiver system. The TIA system 10 is configured to amplify an input current signal, demonstrated in the example of FIG. 1 as a current $I_{IN}$, to generate an output voltage signal $V_{OUT}$.

The TIA system 10 includes a feed-forward stage 12, an inverter TIA stage 14, and a noise-canceling inverter stage 16 that are all arranged in parallel between an input node 18 on which the input current signal $I_{IN}$ is received and an output node 20 on which the output voltage signal $V_{OUT}$ is provided. As an example, the feed-forward stage 12 can be configured as a feed-forward resistor that can pass noise from the input node 18 to the output node 20. For example, the noise can be provided from a source of the input current signal $I_{IN}$, such as from a photodiode in an optical receiver system (e.g., thermal circuit noise). The inverter TIA stage 14 can be configured, for example, as a complementary metal-oxide semiconductor (CMOS) inverter, and can thus invert the input current signal $I_{IN}$ to provide a first inverted signal component at the output node 20, as described in greater detail herein.

As an example, the noise-canceling inverter stage 16 can be arranged as a voltage-gain common-source amplifier with respect to the output node 20. Therefore, the noise-canceling inverter stage 16 can be configured to invert the input current signal $I_{IN}$ to provide a second inverted signal component at the output node 20, and can likewise invert the noise that is provided on the input node 18. Based on the combination of the first and second inverted signal components at the output node 20 via the inverter TIA stage 14 and the noise-canceling inverter stage 16, respectively, the first and second inverted signal components can be constructively combined at the output node 20 to provide the output voltage $V_{OUT}$ as an amplified inverted version of the input signal current $I_{IN}$. As a result, the TIA system can provide an approximately double transimpedance gain.

Additionally, because the noise is passed from the input node 18 to the output node 20 by the feed-forward stage 12, and is inverted by the noise-canceling inverter stage 16, the noise is destructively combined at the output node 20, and is thus substantially mitigated. In other words, because the inverted version of the noise that is provided via the noise-canceling inverter stage 16 is combined with the noise that is provided via the feed-forward stage 12, the noise is substantially canceled at the output node 20. Accordingly, by amplifying the input current signal $I_{IN}$ via the constructive coupling of the first and second inverted signal components and by mitigating the noise via the destructive coupling of the noise, the TIA system 10 provides the output voltage $V_{OUT}$ as having a substantially high signal-to-noise ratio (SNR).

Figure 2:
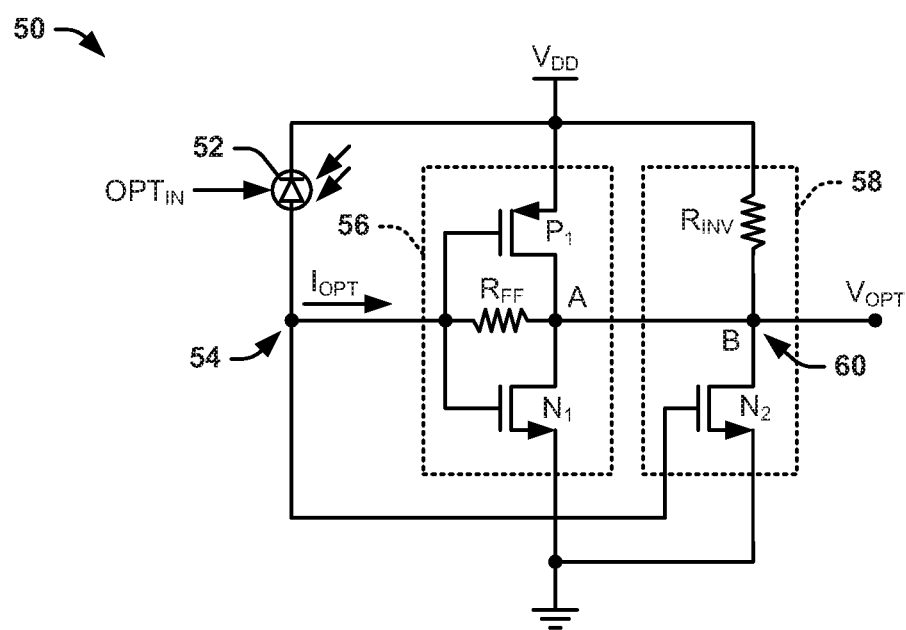
FIG. 2 illustrates an example of a transimpedance amplifier circuit.

FIG. 2 illustrates an example of a TIA circuit 50. The TIA circuit 50 can correspond to the TIA system 10 in the example of FIG. 1, as implemented in an optical receiver system. Thus, in the example of FIG. 2, the TIA circuit 50 includes a photodiode 52 that is configured to receive an optical input signal $OPT_{IN}$ that is arranged between an input node 54 and a high rail voltage, demonstrated in the example of FIG. 2 as a voltage $V_{DD}$. As an example, the optical input signal $OPT_{IN}$ can be an optical communication signal that can be implemented in a variety of different optical communications applications that may require a high sensitivity optical receiver, such as Li-Fi. The photodiode 52 thus provides a current $I_{OPT}$ having an amplitude that corresponds to an intensity of the optical input signal $OPT_{IN}$. As an example, TIA circuit 50 can be implemented as or as part of an integrated circuit (IC) chip.

The TIA system 50 includes a feed-forward resistor $R_{FF}$ that is arranged in parallel with an inverter TIA stage 56 and a noise-canceling inverter stage 58 between the input node 54 and an output node 60 on which an output voltage signal $V_{OUT}$ is provided. The feed-forward resistor $R_{FF}$ can be configured to pass thermal circuit noise generated via the photodiode 52 from the input node 54 to the output node 60. In the example of FIG. 2, the inverter TIA stage 56 is demonstrated as a CMOS inverter. Thus, the inverter TIA stage 56 includes an N-channel metal-oxide semiconductor field effect transistor (MOSFET) $N_1$ arranged between the output node 60 and a low voltage rail, demonstrated in the example of FIG. 2 as ground, and a P-channel MOSFET $P_1$ arranged between the voltage $V_{DD}$ and the output node 60. Each of the N-channel MOSFET $N_1$ and the P-channel MOSFET $P_1$ has a gate that is coupled to the input node 54 and an output that is coupled to the output node 60. Therefore, the inverter TIA stage 56 is configured to invert the input current signal $I_{OPT}$ to provide a first inverted signal component at the output node 60. In the example of FIG. 2, the first inverted signal component provided via the inverter TIA stage 56 and the thermal circuit noise provided via the feed-forward resistor $R_{FF}$ are collectively provided at "A", as described in greater detail herein.

In the example of FIG. 2, the noise-canceling inverter stage 58 includes a resistor $R_{INV}$ that interconnects the high voltage rail $V_{DD}$ and the output node 60 and an N-channel MOSFET $N_2$ that is arranged between the output node 60 and ground. The N-channel MOSFET $N_2$ includes a gate that is coupled to the input node 54. Therefore, the noise-canceling inverter stage 58 is arranged as a voltage-gain common-source amplifier with respect to the output node 60. As a result of the voltage-gain common-source amplifier arrangement of the noise-canceling inverter stage 58, the noise-canceling inverter stage 58 is configured to provide a second inverted signal component at the output node 60, and is configured to likewise invert the thermal circuit noise that is provided on the input node 54. In the example of FIG. 2, the second inverted signal component provided via the noise-canceling inverter stage 58 and the inverted thermal circuit noise are collectively provided at "B", as described in greater detail herein.

Figure 3:
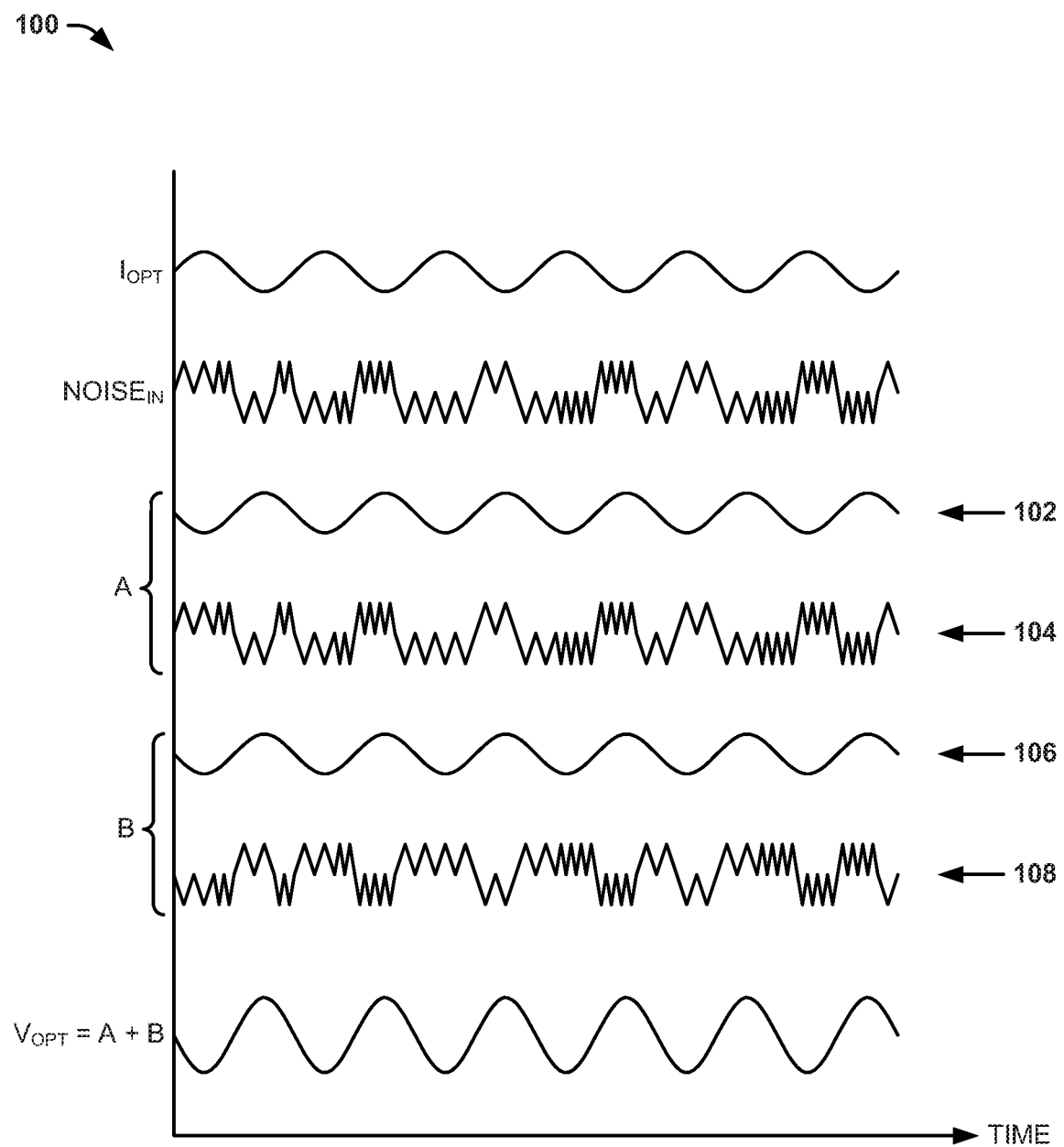
FIG. 3 illustrates an example of a timing diagram.

FIG. 3 illustrates an example of a timing diagram 100. The timing diagram 100 demonstrates a plurality of signals associated with the TIA circuit 50 plotted as a function of time. In the example of FIG. 3, the timing diagram 100 demonstrates the input current signal $I_{OPT}$, demonstrated as a substantially sinusoidal signal by example. The timing diagram 100 also demonstrates a noise signal, demonstrated as NOISEIN, that can correspond to the thermal circuit noise that is generated by the photodiode 52.

The timing diagram 100 also demonstrates the signals at "A" in the example of FIG. 2, including the first inverted signal component, demonstrated in the example of FIG. 3 at 102, provided via the inverter TIA stage 56, as well as a first thermal circuit noise component, demonstrated in the example of FIG. 3 at 104, provided via the feed-forward resistor $R_{FF}$. The timing diagram also demonstrates the signals at "B" in the example of FIG. 2, including the second inverted signal component, demonstrated in the example of FIG. 3 at 106, as well as a second thermal noise component, demonstrated in the example of FIG. 3 at 108 and as inverted relative to the first thermal noise component 104, that are each provided via the noise-canceling inverter stage 58.

In the example of FIG. 2, the signals at "A" and the signals at "B" are provided on the same node (e.g., the output node 60), and are thus combined via the feed-forward resistor $R_{FF}$, the inverter TIA stage 56, and the noise-canceling inverter stage 58. Therefore, the first inverted signal component 102 is combined with the second inverted signal component 106 at the output node 60. Because the first and second inverted signal components 102 and 106 have approximately the same phase (e.g., are both inverted versions of the input signal current $I_{OPT}$), the first and second inverted signal components 102 and 106 are combined constructively at the output node 60 to provide the output voltage $V_{OUT}$ as an amplified inverted version of the input signal current $I_{OPT}$. Additionally, the first thermal noise component 104 is combined with the second thermal noise component 108 at the output node 60. Because the first and second thermal noise components 104 and 108 are inverted relative to each other, the first and second thermal noise components 104 and 108 combine destructively, and are thus substantially canceled from the output voltage $V_{OUT}$. Accordingly, by amplifying the input current signal $I_{OPT}$ via the constructive coupling of the first and second inverted signal components 102 and 106 and by mitigating the noise via the destructive coupling of the first and second thermal noise components 104 and 108, the TIA circuit 50 provides the output voltage $V_{OUT}$ as having a substantially high SNR.

Based on the constructive coupling of the first and second inverted signal components 102 and 106, the transimpedance gain of the TIA circuit 50 is approximately doubled compared to typical CMOS inverter TIA systems, while maintaining sufficient input resistance and bandwidth for operation in optical receiver systems. Additionally, the canceling of the first and second noise components 104 and 108 results in considerable noise reduction relative to typical CMOS inverter TIA systems. Particularly, the feed-forward mechanism provided via the feed-forward resistor $R_{FF}$ and the noise-canceling inverter stage 58 helps to cancel the output noise voltages by properly adjusting the gain (e.g., transconductance) of the noise-canceling inverter stage 58.

In addition, the input impedance of the noise-canceling inverter stage 58, based on the input of the N-channel MOSFET $N_2$, can be very high. As a result, TIA circuit 50 can have an input impedance that is approximately the same as typical CMOS inverter TIA systems since the added parallel noise-canceling inverter stage 58 has such a very large input impedance with respect to the input current signal $I_{OPT}$ at to the gate of the N-channel MOSFET $N_2$. Therefore, the input impedance Zin of the TIA circuit 50 can be expressed as:

$$Zin = \frac{R_{FF}}{1+A_1} \approx \frac{R_F}{1+(g_{m1p}+g_{m1n})(r_{o1p}\|r_{o1n})} \quad \text{Equation 1}$$

And a mid-band transimpedance gain ($Z_T$) is expressed as:

$$Z_T = \frac{A_1}{1+A_1}R_{FF} + A_2\frac{R_F}{1+A_1} \approx 2R_{FF} \quad \text{Equation 2}$$

Whereas:
$A_1$ is the voltage gain of the inverter TIA stage 56, and thus $A_1 \approx (g_{m1n}+g_{m1p})(r_{o1n}\|r_{o1p})$;
$g_{m1p}$ is a tranconductance of the P-channel MOSFET $P_1$;
$g_{m1n}$ is a tranconductance of the N-channel MOSFET $N_1$;
$r_{o1p}$ is a resistance of the P-channel MOSFET $P_1$;
$r_{o1n}$ is a resistance of the N-channel MOSFET $N_1$;
A2 is the voltage gain of the noise-canceling inverter stage 58, and thus $A_1 \approx g_{m2} \times R_{INV}$;
$g_{m2}$ is a tranconductance of the N-channel MOSFET $N_2$.
Accordingly, input referred current root-mean-square (RMS) noise can be integrated from DC to a TIA system bandwidth (e.g., approximately 22 GHz), which can be approximately 3.6 µA for the TIA circuit 50, as opposed to approximately 4.4 µA for a typical TIA system. Thus, the TIA circuit 50 can achieve approximately 1.7 dB improved noise performance relative to a typical TIA system.

It is to be understood that the TIA circuit 50 is not intended to be limited to the example of FIG. 2. As an example, the TIA circuit 50 can implement a different arrangement for each of the inverter TIA stage 56 and/or the noise-canceling inverter stage 58, such as with respect to the type of transistors. As another example, it is to be understood that the TIA circuit 50 could be implemented as or as part of an IC chip that includes additional components of an optical receiver system, such as an output buffer and/or an analog-to-digital converter (ADC). Furthermore, it is to be understood that the output voltage $V_{OUT}$ can be subject to additional sources of noise, such as switching noise from the transistors $N_1$ and $P_1$, and thus some noise can be present on the output voltage $V_{OUT}$.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A transimpedance amplifier (TIA) system comprising:
    an inverter TIA stage configured to:
        interconnect an input node and an output node; and
        invert an input signal at the input node, wherein the inversion of the input signal provides a first inverted signal component at the output node; and
    a noise-canceling inverter stage arranged in parallel with the inverter TIA stage, wherein the noise-canceling inverter stage is configured to:
        invert the input signal to provide a second inverted signal component; and
        invert noise from the input node, wherein the first and second inverted signal components constructively combine at the output node and the noise is substantially mitigated at the output node.

2. The TIA system of claim 1, further comprising a feed-forward resistor arranged in parallel with the inverter stage and to provide the noise from the input node to the output node, such that the noise-canceling inverter stage substantially cancels the noise based on inverting the noise at the output node.

3. The TIA system of claim 1, wherein the noise-canceling inverter stage is arranged as a voltage-gain common-source amplifier with respect to the output node.

4. The TIA system of claim 1, wherein the noise-canceling inverter stage comprises:
    a transistor having an input coupled to the input node and an output coupled to the output node; and
    a resistor interconnecting a high rail voltage and the output node.

5. The TIA system of claim 1, wherein the inverter TIA stage comprises:
    an N-type transistor having an input coupled to the input node and an output coupled to the output node; and
    a P-type transistor having an input coupled to the input node and an output coupled to the output node.

6. The TIA system of claim 1, wherein the inverter TIA stage and the noise-canceling inverter stage are configured to provide a double transimpedance gain.

7. The TIA system of claim 1, wherein an input impedance of the TIA system is expressed as:

$$Zin = \frac{R_{FF}}{1+A_1} \approx \frac{R_F}{1+(g_{m1p}+g_{m1n})(r_{o1p}\|r_{o1n})}$$

8. The TIA system of claim 1, wherein a mid-band transimpedance gain ($Z_T$) of the TIA system is expressed as:

$$Z_T = \frac{A_1}{1+A_1}R_{FF} + A_2\frac{R_F}{1+A_1} \approx 2R_{FF}$$

9. The TIA system of claim 1, further comprising a feed-forward resistor that is arranged in parallel with the noise-canceling inverter stage.

10. The TIA system of claim 9, wherein the feed-forward resistor is configured to pass thermal circuit noise generated via a photodiode from the input node to the output node.

11. An optical receiver comprising the TIA system of claim 1.

12. The optical receiver of claim 11, further comprising a photodiode to generate the input signal as an input current in response to an input optical signal.

13. An integrated circuit (IC) chip comprising the TIA system of claim 1.

14. A transimpedance amplifier (TIA) system comprising:
    an inverter TIA stage interconnecting an input node and an output node and to invert an input signal at the input node to provide a first inverted signal component at the output node;
    a feed-forward resistor arranged in parallel with the inverter stage and to provide the noise from the input node to the output node; and
    a noise-canceling inverter stage arranged in parallel with the inverter stage and being to invert the input signal to provide a second inverted signal component and to invert the noise from the input node, such that the first and second inverted signal components constructively combine at the output node and to destructively combine the noise provided via the feed-forward resistor and the inverted noise.

15. The TIA system of claim 14, wherein the noise-canceling inverter stage is arranged as a voltage-gain common-source amplifier with respect to the output node.

16. The TIA system of claim 14, wherein the noise-canceling inverter stage comprises:
    a transistor having an input coupled to the input node and an output coupled to the output node; and
    a resistor interconnecting a high rail voltage and the output node.

17. An optical receiver comprising the TIA system of claim 14, the optical receiver further comprising a photodiode to generate the input signal in response to an input optical signal.

18. An optical receiver system comprising a transimpedance amplifier (TIA) system, the TIA system comprising:
    a photodiode to receive an optical input signal and to generate an input current signal in response;
    an inverter TIA stage interconnecting an input node and an output node and to invert the input current signal at the input node to provide a first inverted voltage signal component at the output node;
    a feed-forward resistor arranged in parallel with the inverter TIA stage and to transmit a first noise component from the input node to the output node; and a noise-canceling inverter stage arranged as a voltage-gain common-source amplifier with respect to the output node in parallel with the inverter TIA stage, the noise-canceling inverter stage configured to invert the input current signal and the first noise component from the input node to provide a second inverted voltage signal component and a second noise component at the output node, the first and second inverted voltage signal components constructively combining at the output node and the first and second noise components destructively combining at the output node to provide an output signal having an amplitude that is approximately equal to a sum of the first and second voltage signal components.

19. The TIA system of claim 18, wherein the noise-canceling inverter stage comprises:

a transistor having an input coupled to the input node and an output coupled to the output node; and a resistor interconnecting a high rail voltage and the output node.

20. An integrated circuit (IC) chip comprising the optical receiver of claim 18.

\* \* \* \* \*